(12) United States Patent
Walther et al.

(10) Patent No.: US 8,338,796 B2
(45) Date of Patent: Dec. 25, 2012

(54) ELECTRON BEAM EMITTER WITH SLOTTED GUN

(75) Inventors: Steven Raymond Walther, Andover, MA (US); Michael L. Bufano, Belmont, MA (US); Gerald M. Friedman, New Ipswich, NH (US)

(73) Assignee: Hitachi Zosen Corporation, Suminoe-Ku (JP)

( * ) Notice: Subject to any disclaimer, the term of this patent is extended or adjusted under 35 U.S.C. 154(b) by 93 days.

(21) Appl. No.: 12/469,123

(22) Filed: May 20, 2009

(65) Prior Publication Data

US 2009/0289204 A1 Nov. 26, 2009

Related U.S. Application Data

(60) Provisional application No. 61/055,025, filed on May 21, 2008.

(51) Int. Cl.
*G21K 5/00* (2006.01)
(52) U.S. Cl. .............. 250/423 R; 250/424; 250/427; 315/39.57; 315/111.01; 315/111.81; 313/107.5; 313/420
(58) Field of Classification Search .......... 250/423 R, 250/424, 427, 492.1, 493.1, 494.1; 315/39.57, 315/111.01, 111.81; 313/107.5, 420
See application file for complete search history.

(56) References Cited

U.S. PATENT DOCUMENTS

| | | | |
|---|---|---|---|
| 3,484,645 A | 12/1969 | Drees | |
| 3,588,565 A | 6/1971 | Trump | |
| 3,749,967 A | 7/1973 | Douglas-Hamilton et al. | |
| 4,328,443 A | 5/1982 | Zappa | |
| 5,561,342 A | 10/1996 | Roeder et al. | |
| 5,621,270 A | 4/1997 | Allen | |
| 5,932,972 A | 8/1999 | Symons | |
| 5,962,995 A | 10/1999 | Avnery | |
| 6,346,768 B1 | 2/2002 | Proudfoot | |

(Continued)

FOREIGN PATENT DOCUMENTS

DE 40 02 049 A1 7/1991

(Continued)

OTHER PUBLICATIONS

Tanabe, E., et al., "A Small Diameter Standing Wave Linear Accelerator Structure", *IEEE Transactions on Nuclear Science*, vol. NS-32, No. 5, pp. 2975-2977, Oct. 1985.

(Continued)

*Primary Examiner* — David A Vanore
*Assistant Examiner* — Nicole Ippolito
(74) *Attorney, Agent, or Firm* — Ropes & Gray LLP

(57) ABSTRACT

An electron beam emitter includes an electron generator for generating electrons. The electron generator can have a housing containing at least one electron source for generating the electrons. The at least one electron source has a width. The electron generator housing can have an electron permeable region spaced from the at least one electron source for allowing extraction of the electrons from the electron generator housing. The electron permeable region can include a series of narrow elongate slots and ribs formed in the electron generator housing and extending laterally beyond the width of the at least one electron source. The electron permeable region can be configured and positioned relative to the at least one electron source for laterally spreading the electrons that are generated by the at least one electron source.

28 Claims, 15 Drawing Sheets

U.S. PATENT DOCUMENTS

| | | | |
|---|---|---|---|
| 6,407,492 B1 | 6/2002 | Avnery et al. | |
| 6,545,398 B1* | 4/2003 | Avnery | 313/361.1 |
| 6,630,774 B2 | 10/2003 | Avnery | |
| 6,674,229 B2 | 1/2004 | Avnery et al. | |
| 7,045,793 B2 | 5/2006 | Wahlin | |
| 7,148,613 B2 | 12/2006 | Dally et al. | |
| 7,265,367 B2 | 9/2007 | Avnery et al. | |
| 2002/0135285 A1 | 9/2002 | Avnery | |
| 2002/0135290 A1 | 9/2002 | Avnery | |
| 2006/0125371 A1* | 6/2006 | Hideshima et al. | 313/402 |
| 2007/0188090 A1* | 8/2007 | Kimiya et al. | 313/506 |

FOREIGN PATENT DOCUMENTS

| | | |
|---|---|---|
| EP | 1 374 273 A | 1/2004 |
| JP | 2007-250531 | 9/2007 |
| WO | WO 01/04924 | 1/2001 |
| WO | WO 02/075771 | 9/2002 |

OTHER PUBLICATIONS

International Search Report from PCT/US2009/003116, date of mailing Feb. 16, 2010.

Written Opinion of the International Searching Authority from PCT/US2009/003116, date of mailing Feb. 16, 2010.

* cited by examiner

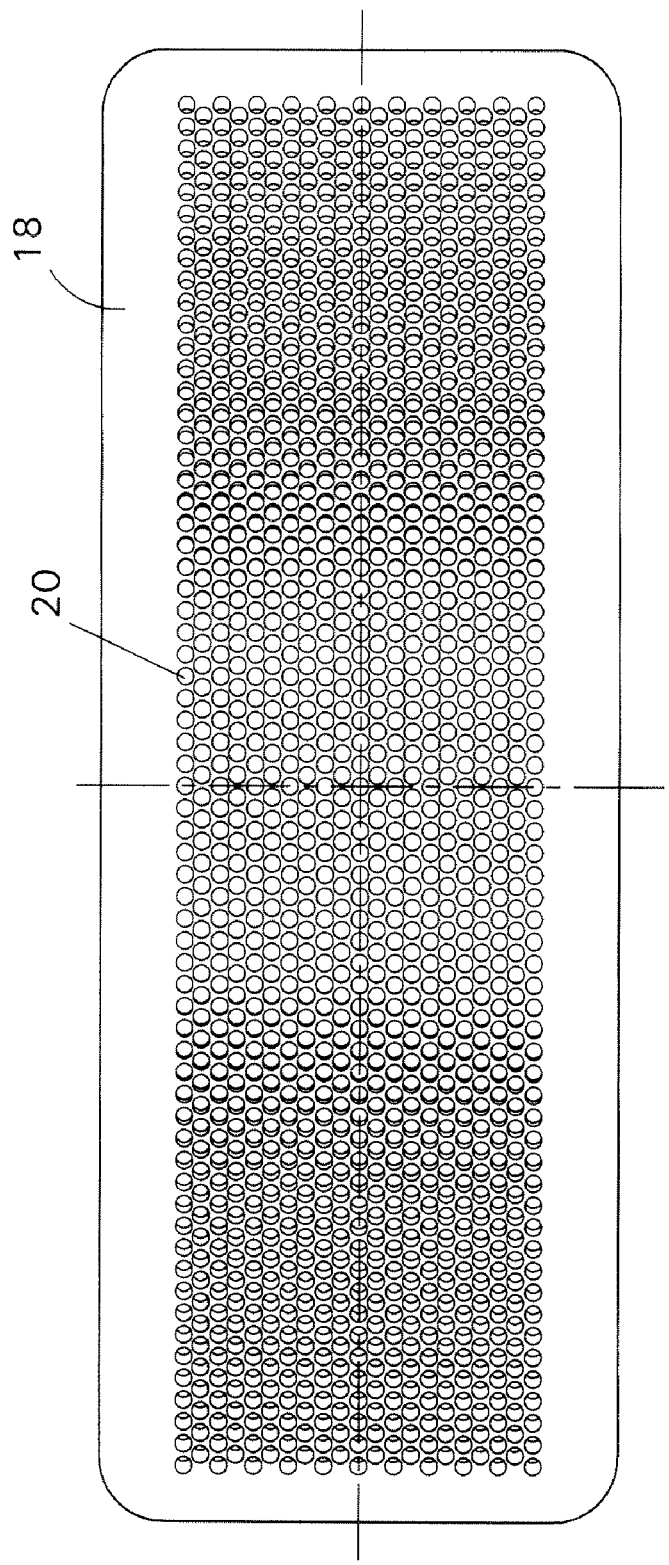
FIG. 14
FIG. 15 ial Application No. 61/055,025, filed on May 21, 2008. The
ELECTRON BEAM EMITTER WITH SLOTTED GUN

RELATED APPLICATION

This application claims the benefit of U.S. Provisional Application No. 61/055,025, filed on May 21, 2008. The entire teachings of the above application are incorporated herein by reference.

BACKGROUND

An electron beam emitter commonly includes an electron gun or generator for generating electrons, which is positioned within a vacuum chamber. The vacuum chamber has an electron beam exit window foil at one end through which the electrons from the electron gun are accelerated by a voltage potential imposed between the electron gun and the exit window foil. The electron gun can include a housing enclosing one or more elongate line source filaments, for example two, which produce electrons when electrical power is passed through the filaments. The electron gun housing generally includes a grid pattern of small round holes below the filaments which allow the electrons produced by the filaments to exit the electron gun housing for acceleration out the exit window foil. Typically, the electrons that reach the exit window foil from each filament are focused in a line pattern resembling or corresponding to the narrow elongate shape of the filaments. For example, this can be seen in the graph of FIG. 1, which depicts a typical pattern of electrons at the exit window foil from an electron gun having two elongate filaments, where the electrons are concentrated in two narrow elongate lines 8 corresponding to the two filaments, while the surrounding areas 9 have lower concentrations of electrons. Having a nonuniform electron distribution with such higher and lower intensity electron spots or regions can limit the overall beam power used. In addition, in cases where the electron beam emitter is operated close to a product that is being irradiated or within a low pressure or vacuum environment, with little or no air present to scatter the electrons, the electrons reaching the product could in some situations still be in the pattern depicted in FIG. 1, resulting in uneven irradiation.

SUMMARY

The present invention can provide an electron beam emitter including an electron generator for generating electrons. The electron generator can have a housing containing at least one electron source for generating the electrons. The at least one electron source has a width. The electron generator housing can have an electron permeable region spaced from the at least one electron source for allowing extraction of the electrons from the electron generator housing. The electron permeable region can include a series of narrow elongate slots and ribs formed in the electron generator housing and extending laterally beyond the width of the at least one electron source. The electron permeable region can be configured and positioned relative to the at least one electron source for laterally spreading the electrons that are generated by the at least one electron source.

In particular embodiments, the electron source can be an elongate electron source. The slots can be at an angle ranging from about 30° to 90° relative to the elongate electron source, or can be at an acute angle. The slots can be about ⅛ to 3/16 inches wide, and the ribs can be about 0.030 to 0.040 inches wide. The electron permeable region can have an elongate length and width, and the length of the electron permeable region can have a longitudinal axis. The slots can be positioned on a pitch of about ¼ inches relative to the longitudinal axis. The electron permeable region can have a slot width to rib width ratio of about 3 to 1 to about 6 to 1. The electron generator housing can be made of sheet metal and have a planar portion, and the electron permeable region can be integrally formed within the planar portion. The electron generator can be positioned within a vacuum chamber having an electron beam exit window, and spaced from the exit window for accelerating the electrons out the exit window. The slots and ribs of the electron permeable region can be configured to allow an electrical field extending between the electron generator housing and the exit window to penetrate into the electron generator housing through each slot and laterally relative to the at least one electron source to form a transverse electrical field region surrounding the at least one electron source for laterally spreading the electrons relative to the at least one electron source. In some embodiments, the exit window can include a support plate supporting an exit window foil. The support plate can have a series of holes therethrough for allowing passage of the electrons. The holes can be continuously angled outwardly moving toward two opposite ends. In some embodiments, the electron permeable region can include first and second rows of slots, where the slots of the first row are angled relative to the slots of the second row.

The present invention can also provide an electron beam emitter, including a vacuum chamber having an electron beam exit window. An electron generator for generating electrons for acceleration out the exit window can be positioned within the vacuum chamber and spaced from the exit window. The electron generator can have a housing containing at least one electron source for generating the electrons. The at least one electron source has a width. The electron generator housing can have an electron permeable region spaced from the at least one electron source for allowing extraction of the electrons from the electron generator housing. The electron permeable region can include a series of narrow elongate slots and ribs integrally formed in a planar sheet metal portion of the electron generator housing and extending laterally beyond the width of the at least one electron source. The slots and ribs of the electron permeable region can be configured to allow an electrical field extending between the electron generator housing and the exit window to penetrate into the electron generator housing through each slot and laterally relative to the at least one electron source to form a transverse electrical field region surrounding the at least one electron source for laterally spreading the electrons relative to the at least one electron source before extraction from the electron generator housing.

In particular embodiments, the electron source can be an elongate electron source. The slots can be at an angle ranging from about 30° to 90° relative to the elongate electron source, or can be at an acute angle. The slots can be about ⅛ to 3/16 inches wide, and the ribs can be about 0.030 to 0.040 inches wide. The electron permeable region can have an elongate length and width, and the length of the electron permeable region can have a longitudinal axis. The slots can be positioned on a pitch of about ¼ inches relative to the longitudinal axis. The electron permeable region can have a slot width to rib width ratio of about 3 to 1 to about 6 to 1. In some embodiments, the exit window can include a support plate supporting an exit window foil. The support plate can have a series of holes therethrough for allowing passage of the electrons. The holes can be continuously angled outwardly moving toward two opposite ends. In some embodiments, the electron permeable region can include first and second rows of slots, where the slots of the first row are angled relative to the slots of the second row.

The present invention can also provide a method of dispersing electrons in an electron beam emitter. The electrons can be generated with an electron generator. The electron generator can have a housing containing at least one electron source for generating the electrons. The at least one electron source has a width. The electron generator housing can have an electron permeable region spaced from the at least one electron source for allowing extraction of the electrons from the electron generator housing. The electron permeable region can be configured and positioned relative to the at least one electron source for laterally spreading the electrons that are generated by the at least one electron source. The electron permeable region can include a series of narrow elongate slots and ribs formed in the electron generator housing and extending laterally beyond the width of the at least one electron source.

In particular embodiments, the electrons can be generated with an elongate electron source. The slots can be positioned at an angle ranging from about 30° to 90° relative to the elongate electron source, or can be at an acute angle. The slots can be formed about ⅛ to 3/16 inches wide, and the ribs can be formed about 0.030 to 0.040 inches wide. The electron permeable region can be provided with an elongate length and width, and the length of the electron permeable region can have a longitudinal axis. The slots can be positioned on a pitch of about ¼ inches relative to the longitudinal axis. The electron permeable region can be provided with a slot width to rib width ratio of about 3 to 1 to about 6 to 1. The electron generator housing can be formed from sheet metal with a planar portion, and the electron permeable region can be integrally formed within the planar portion. The electron generator can be positioned within a vacuum chamber having an electron beam exit window, and spaced from the exit window. Electrons extracted from the electron generator can be accelerated out the exit window. The slots and ribs of the electron permeable region can be configured to allow an electrical field extending between the electron generator housing and the exit window to penetrate into the electron generator housing through each slot and laterally relative to the at least one electron source to form a transverse electrical field region surrounding the at least one electron source for laterally spreading the electrons relative to the at least one electron source. In some embodiments the exit window can include a support plate supporting an exit window foil. The support plate can be provided with a series of holes therethrough for allowing passage of the electrons. The holes can be continuously angled outwardly moving towards two opposite ends for matching trajectories of the electrons. In some embodiments, the electron permeable region can be provided with first and second rows of slots, where the slots of the first row are angled relative to the slots of the second row.

The present invention can also provide a method of irradiating a product with an electron beam emitter. Electrons can be generated with an electron generator. The electron generator can have a housing containing at least one electron source for generating the electrons. The at least one electron source has a width. The electron generator housing can have an electron permeable region spaced from the at least one electron source for allowing extraction of the electrons from the electron generating housing. The electron permeable region can include a series of narrow elongate slots and ribs formed in the electron generator housing and extending laterally beyond the width of the at least one electron source. The electron permeable region can be configured and positioned relative to the at least one electron source for laterally spreading the electrons that are generated by the at least one electron source. The product and the electron beam emitter can be moved relative to each other at an acute angle relative to the slots and ribs of the electron permeable region for irradiating the product with the electrons.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 14 is a plan view of an embodiment of a support grid for the exit window foil.

FIG. 15 is a side sectional view of the support grid of FIG. 14.

DETAILED DESCRIPTION

Figure 2:
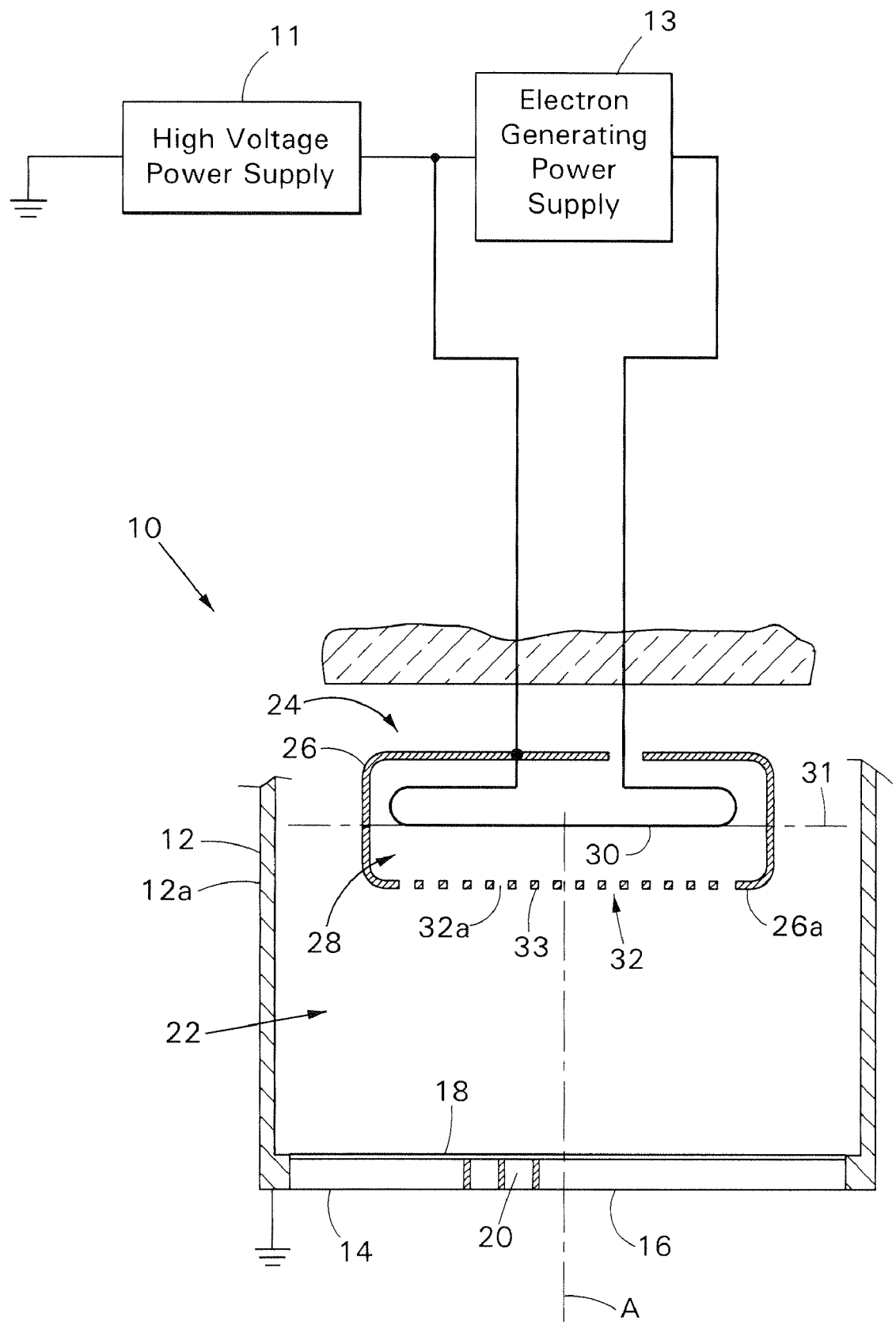
FIG. 2 is a schematic drawing of an embodiment of an electron beam emitter in the present invention.
Figure 3:
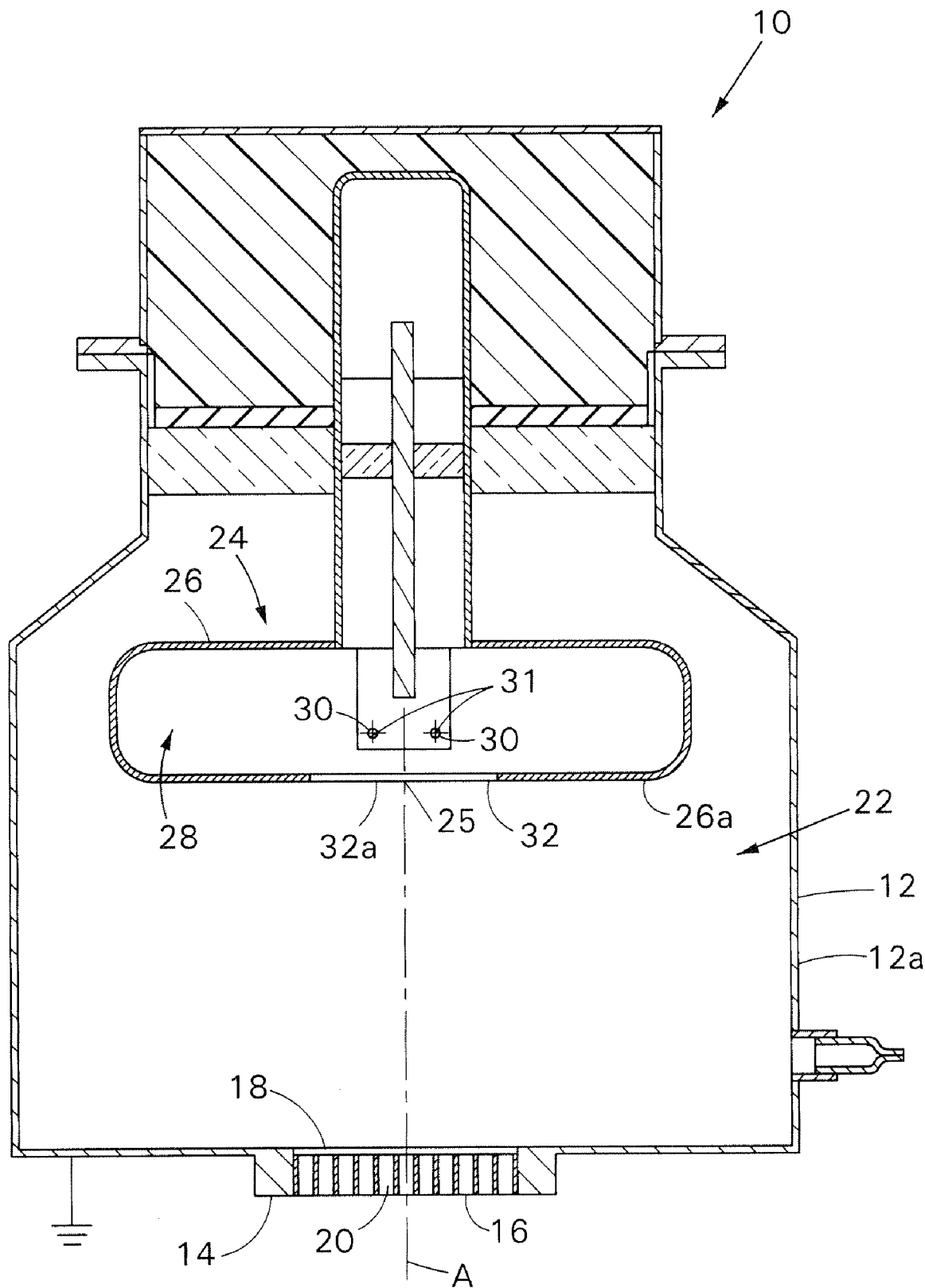
FIG. 3 is a sectional view of the electron beam emitter of FIG. 2.

FIGS. 2 and 3 depict an embodiment of an electron beam emitter, apparatus or device 10 in the present invention. The electron beam emitter 10 can have a vacuum chamber 12, which can be hermetically sealed. The vacuum chamber 12 can have a housing 12a with an electron gun or generator 24 positioned within the interior 22 of the housing 12a and spaced from the walls of housing 12a for generating electrons. The electron gun 24 can include an electron gun or generator housing or enclosure 26. The electron gun housing 26 can contain, enclose, or surround one or more electron generating sources or members 30 positioned within the interior 28 of housing 26. For example, two sources 30 are shown in FIG. 3 and will be described herein as such, but it is understood, that less than or more than two can be employed. The electron generating sources 30 can be elongate line electron sources, including filaments, or other suitable elongate line sources which can have a narrow width or diameter, as known in the art. Electrical power from an electron generating power supply 13 can be passed through the electron sources 30 causing the electron sources 30 to produce electrons e⁻. The vacuum chamber 12 can include an electron beam exit window 14 having a support grid 18 with holes 20 therethrough, which supports an exit window foil 16. The exit window 14 can be generally rectangular in shape. Electrons produced by the electron sources 30 in the electron gun 24 can be accelerated out the exit window 14 in an external electron beam 15 (FIG. 5) by imposing a high voltage electrical potential difference between the electron gun housing 26 and the exit window 14 with a high voltage power supply 11, which forms a high voltage electrical field 23 (FIG. 10) between the electron gun housing 26 and the exit window 14. Reference numeral 23 points to an equal potential line within electrical field 23.

Figure 4:
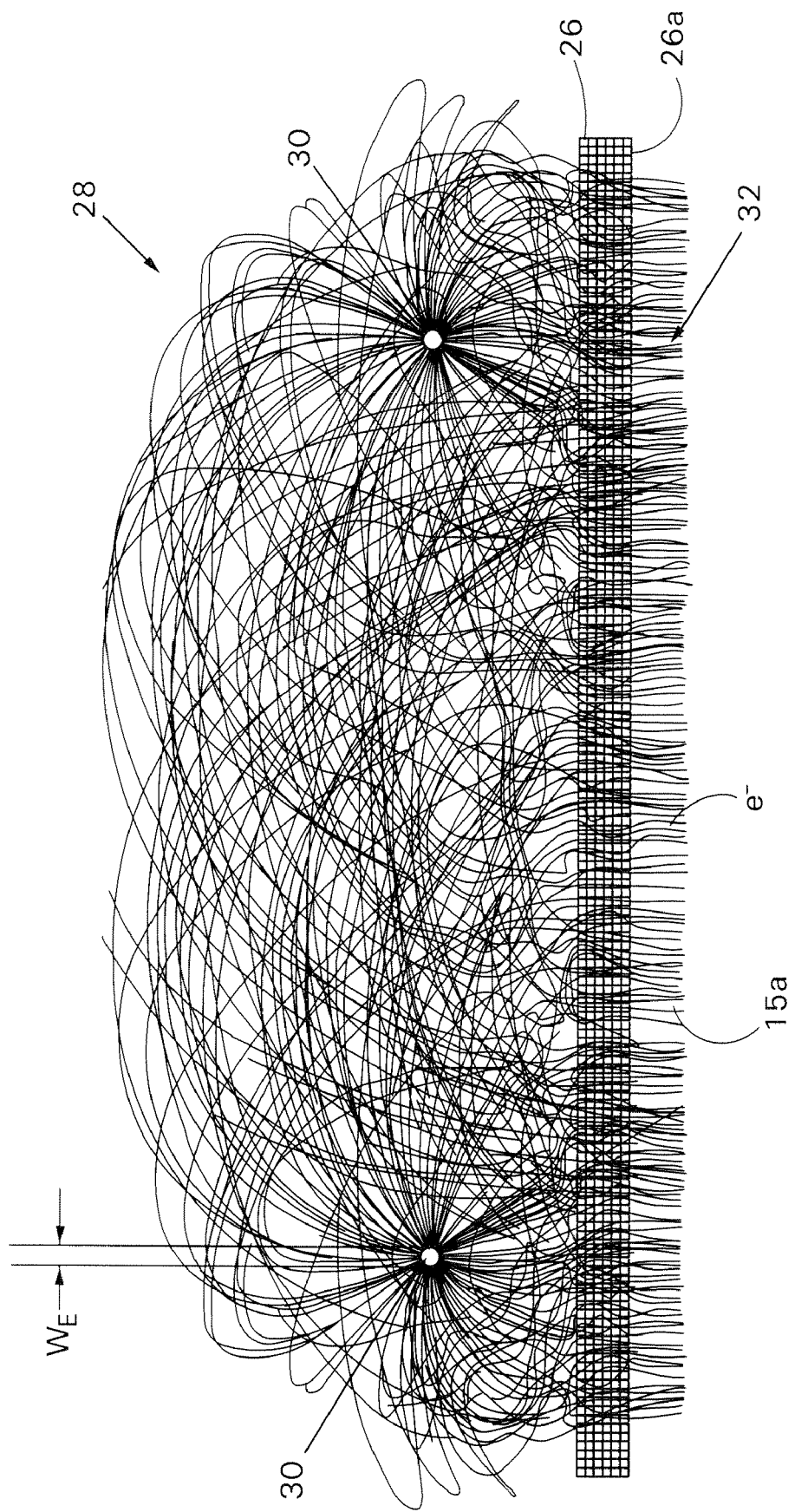
FIG. 4 is a schematic drawing depicting lateral dispersion and trajectories of electrons relative to the width of the electron sources inside an electron gun.
Figure 5:
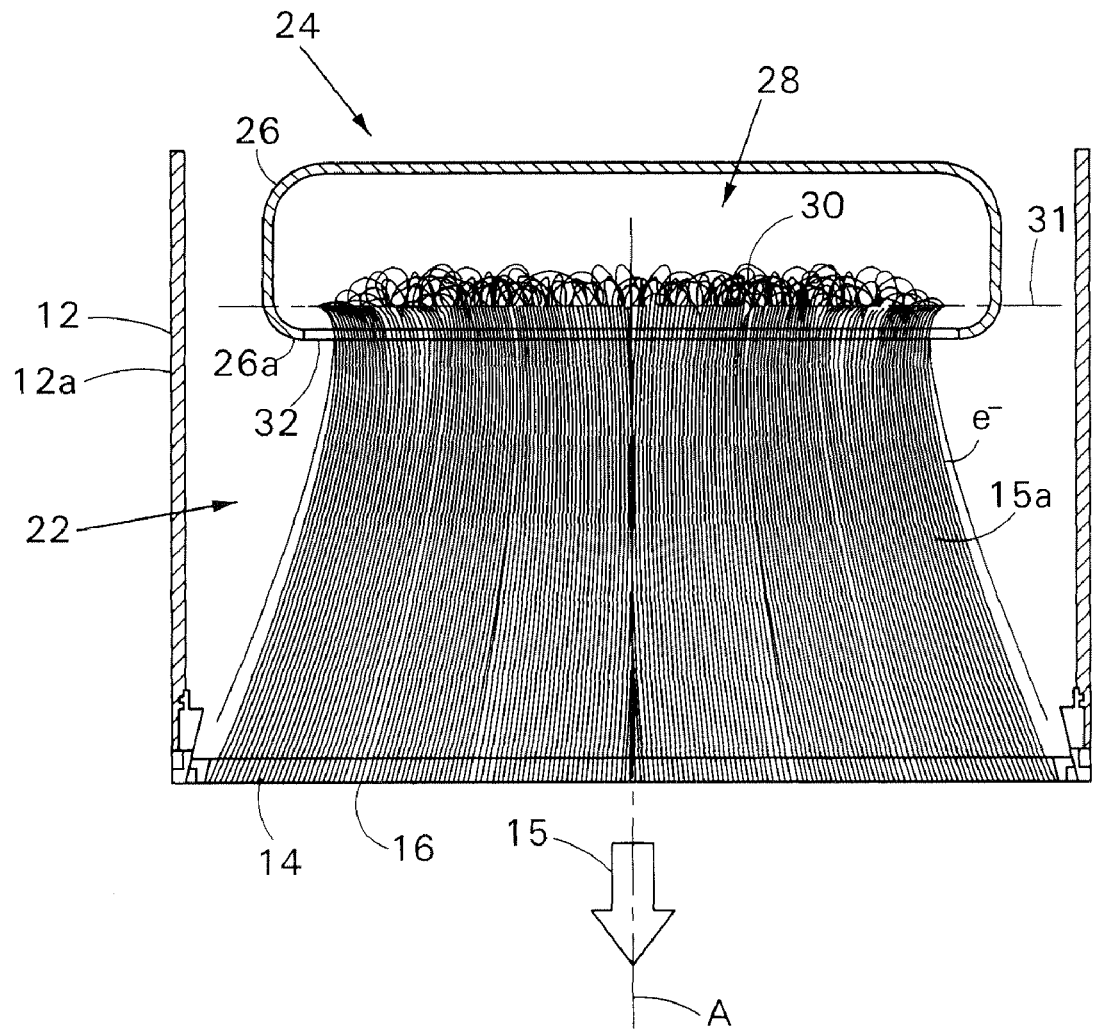
FIG. 5 is a schematic drawing depicting electron trajectories relative to the length of the electron sources and extending to the exit window.

The housing 26 of the electron gun 24 can have an electron permeable region 32 from which the electron sources 30 are spaced. The electron sources 30 can each longitudinally extend along a longitudinal axis 31. The longitudinal axes 31 can be parallel to the electron permeable region 32, and can be on a common plane. The electron gun housing 26 and electron permeable region 32 can be aligned and spaced from the exit window 14 along an axis A which can be along a longitudinal axis of vacuum chamber 12. The electron gun housing 26 and the electron permeable region 32 can be configured for evenly dispersing the electrons e⁻ in a transverse or lateral manner relative to the electron sources 30 to be wider than the diameter or width $W_E$ of the electron sources 30 within the electron gun housing 26, before reaching the electron permeable region 32, as seen in FIG. 4, and therefore before reaching the exit window 14. In addition, the electrons can be evenly dispersed longitudinally relative to electron sources 30, as seen in FIG. 5. By dispersing or spreading the electrons transverse to the line electron sources 30 in an internal electron beam 15a (FIG. 4) within the vacuum chamber 12 before reaching the exit window 14, a more uniform electron distribution can be obtained, and peak power or high intensity spots on the exit window 14 can be reduced, which can permit a higher overall beam power to be used. In addition, more area of the exit window 14 can be utilized and maximized for electron transmission. By averaging electron beam power across the exit window, micro uniformities can be eliminated or reduced. The electron gun 24 can also passively spread the electrons from electron sources 30 without requiring an additional external power source for separately shaping the electrons.

The electron sources 30 can be for example, elongate filaments formed of suitable materials, for example tungsten, which can cause free electrons to form thereon when heated by passing electrical power therethrough for example, 5 to 50 watts, and can have a width $W_E$ or diameter in the range of about 0.005 to 0.020 inches, and can be in some embodiments about 0.009 inches. The electron sources 30 can be also formed of other suitable materials, including lanthanum hexaboride, and can have other widths or diameters. The exit window foil 16 can be a metallic or non metallic foil, for example, titanium, aluminum, beryllium, stainless steel, copper, gold, silver, diamond, ceramics, or combinations thereof Common thicknesses of the exit window foil can be between about 4-13 microns thick, for example 7-10 microns, but can be lower or higher depending upon the voltage and the materials. The voltage potential between the electron gun housing 26 and the exit window 14 can range between 1 KV and 500 KV, but can be lower or higher, and can be commonly between 80 KV and 150 KV.

Referring to FIGS. 6-11, the electron permeable region 32 can include a series of lateral or traverse slots 32a extending across, laterally or transverse relative to the electron sources 30 and axes 31. The slots 32a can be positioned side by side to collectively form the electron permeable region 32 and can extend along a longitudinal axis 25 that is parallel to longitudinal axes 31. The slots 32a can be integrally formed on a flat, planar, lower, bottom, axial, end or side portion 26a of the housing 26 and on a plane parallel to the electron sources 30, and centered relative to axis A. As a result, the electron permeable region 32 can extend in a planar fashion along portion 26a and axis 25.

Figure 8:
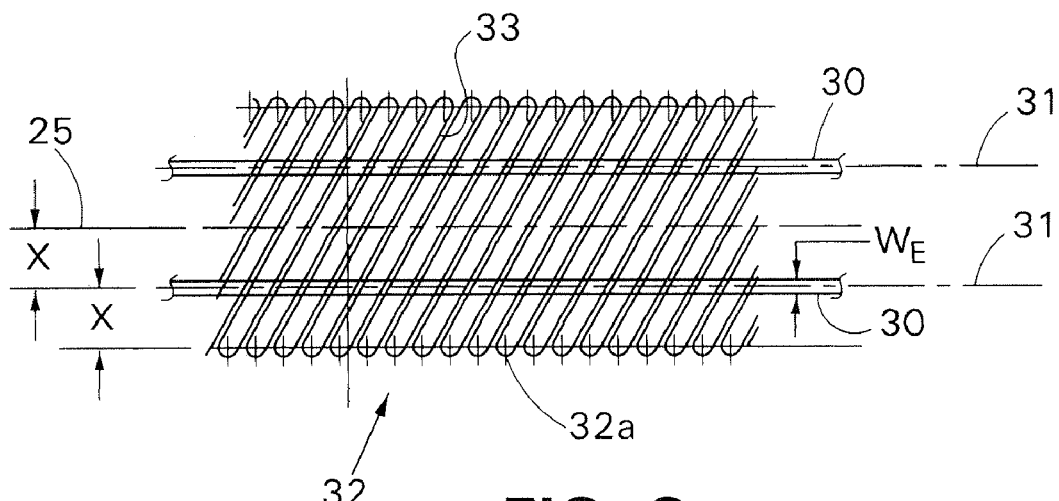
FIG. 8 is a schematic drawing depicting an embodiment of slot orientation relative to two elongate electron generating sources.
Figure 6:
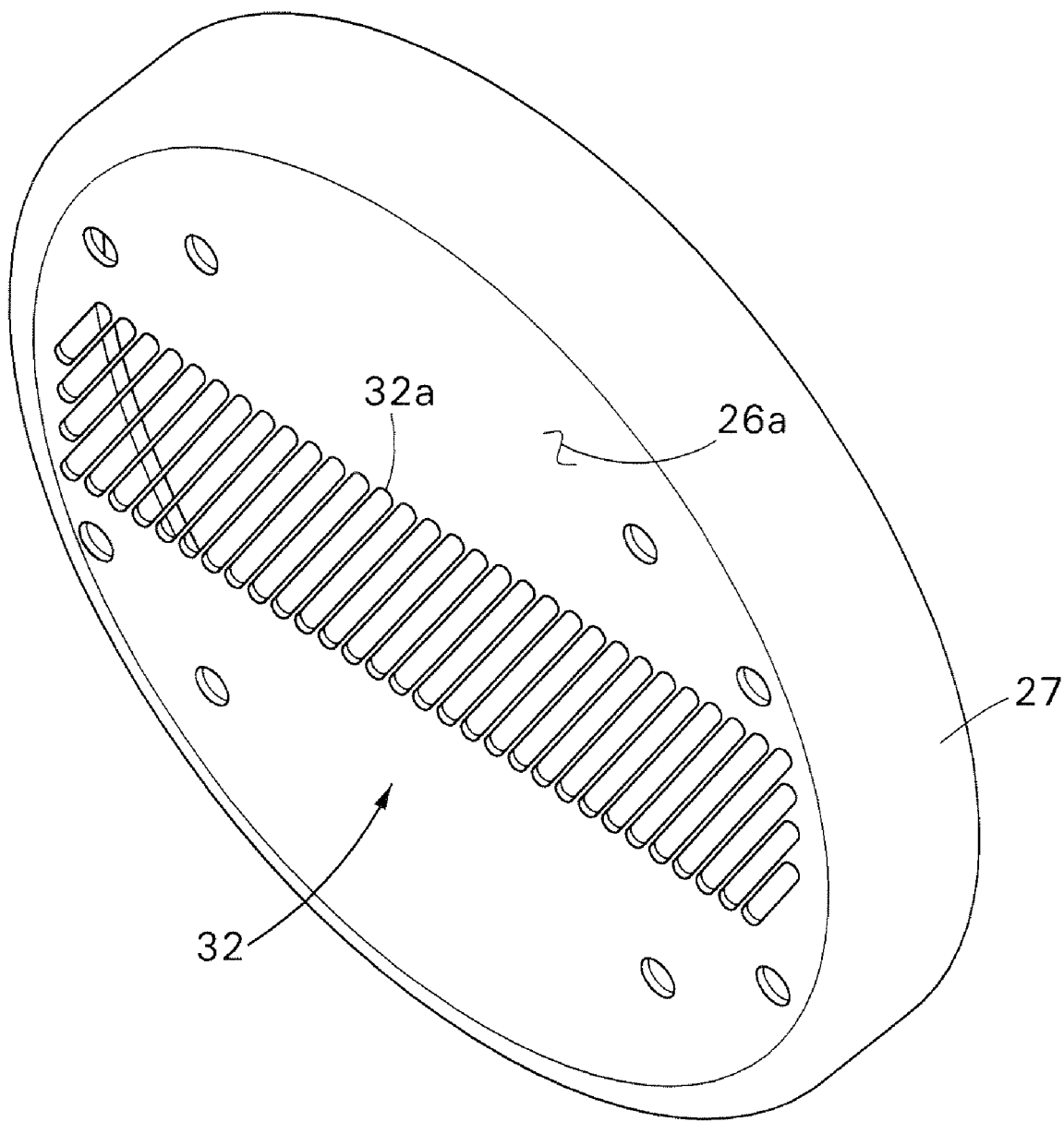
FIG. 6 is a perspective view of a housing portion for an embodiment of an electron gun in the present invention.
Figure 7:
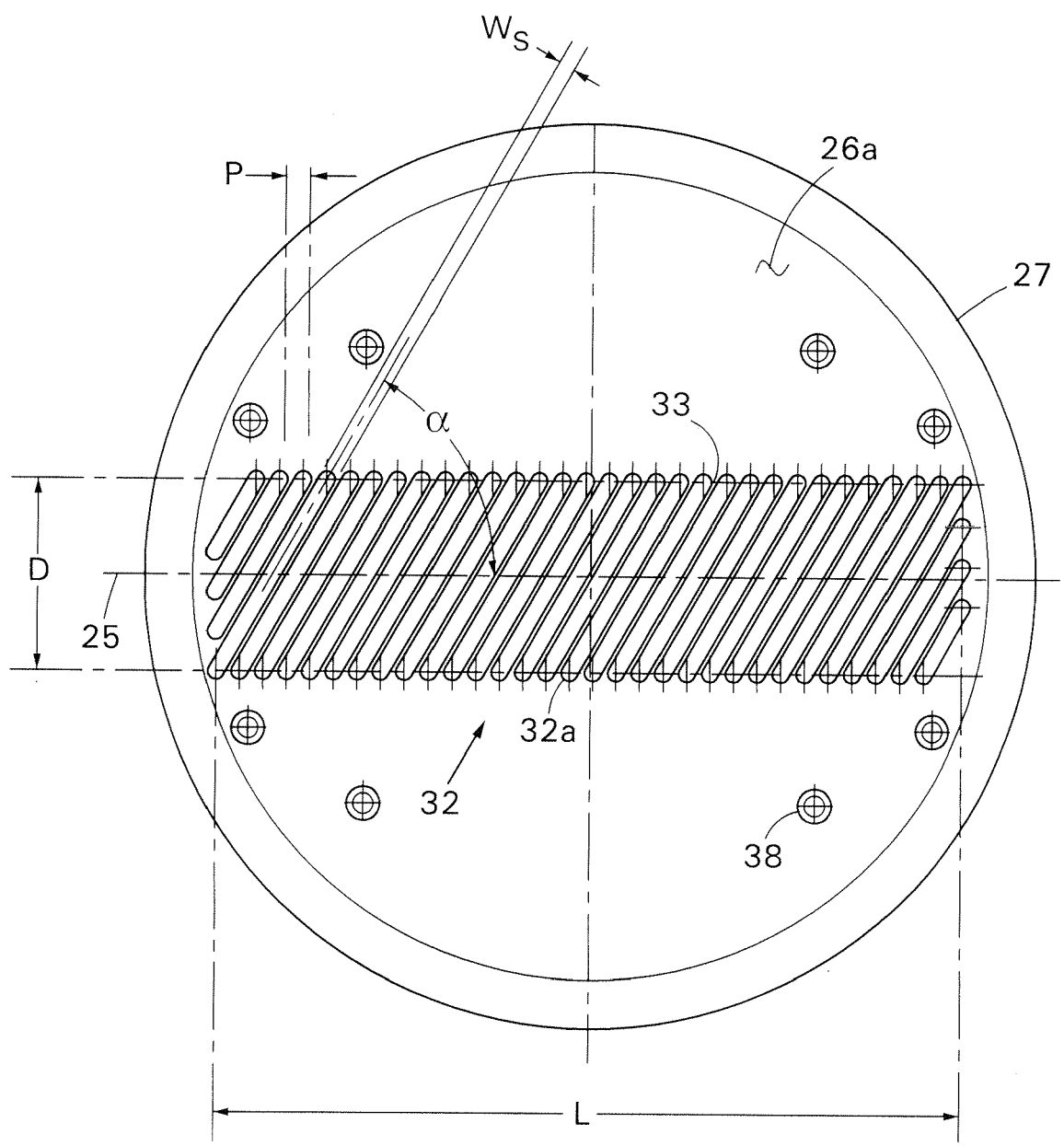
FIG. 7 is a front view of the housing of FIG. 6.
Figure 9:
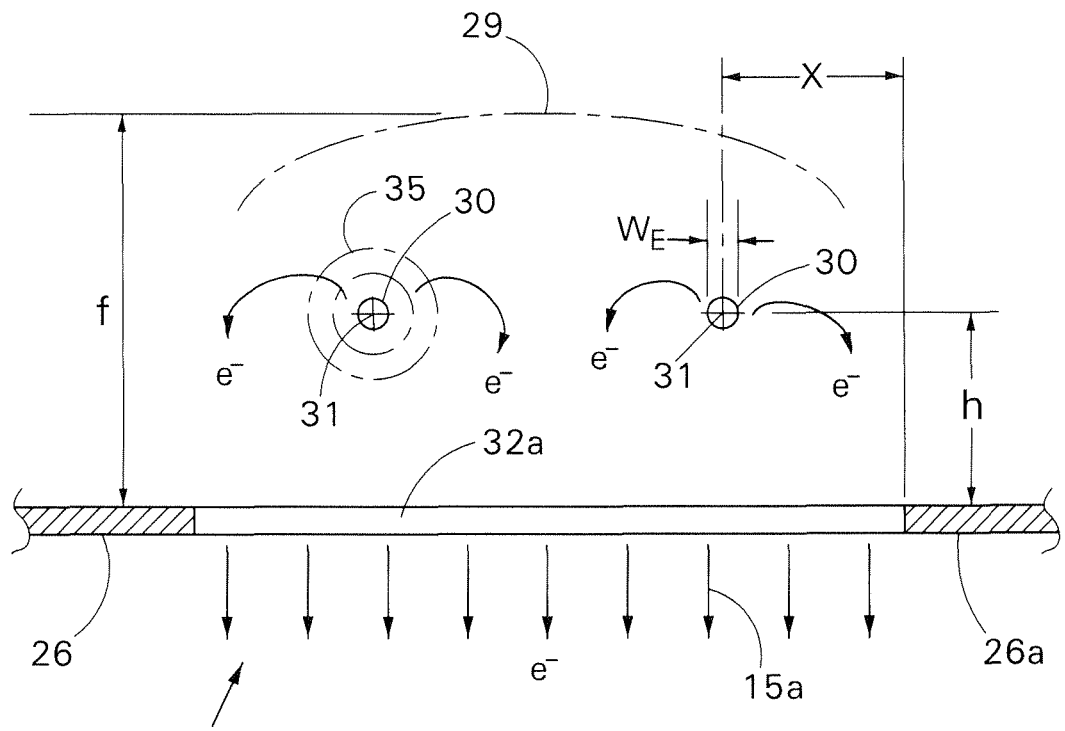
FIG. 9 is a schematic drawing depicting spreading or dispersion of electrons due to electric field distribution inside the electron gun due to transverse slots of the electron permeable region of the electron gun housing.

The transverse slots 32a of the electron permeable region 32 can be closely arranged together side by side in a pattern having a length L extending along axis 25, and a width or lateral distance D, on the flat planar portion 26a of housing 26. The electron permeable region 32 can be generally rectangular. The length of the electron sources 30 along axes 31 can be about the same as the length L of electron permeable region 32, and in some situations, can be slightly longer. Electrons extracted from the housing 26 through the electron permeable region 32 can have a length and width generally matching or corresponding to the length L and width D. The slots 32a can be chevron slots separated from each other by narrow ribs or webs 33. The slots 32a can be angled at an acute angle α relative to axis 25 and/or axes 31 and electron sources 30, which can often range from 30° to 90°, and in some embodiments, 45° to 60°. In some embodiments, angles less than 30° can be used. The ribs 33 can be at the same angle α. The electron permeable region 32 and slots 32a can laterally extend past or beyond the width $W_E$ on one or both lateral sides of each electron source 30 or axis 31 by a lateral or transverse distance X (FIGS. 8 and 9).

Figure 1:
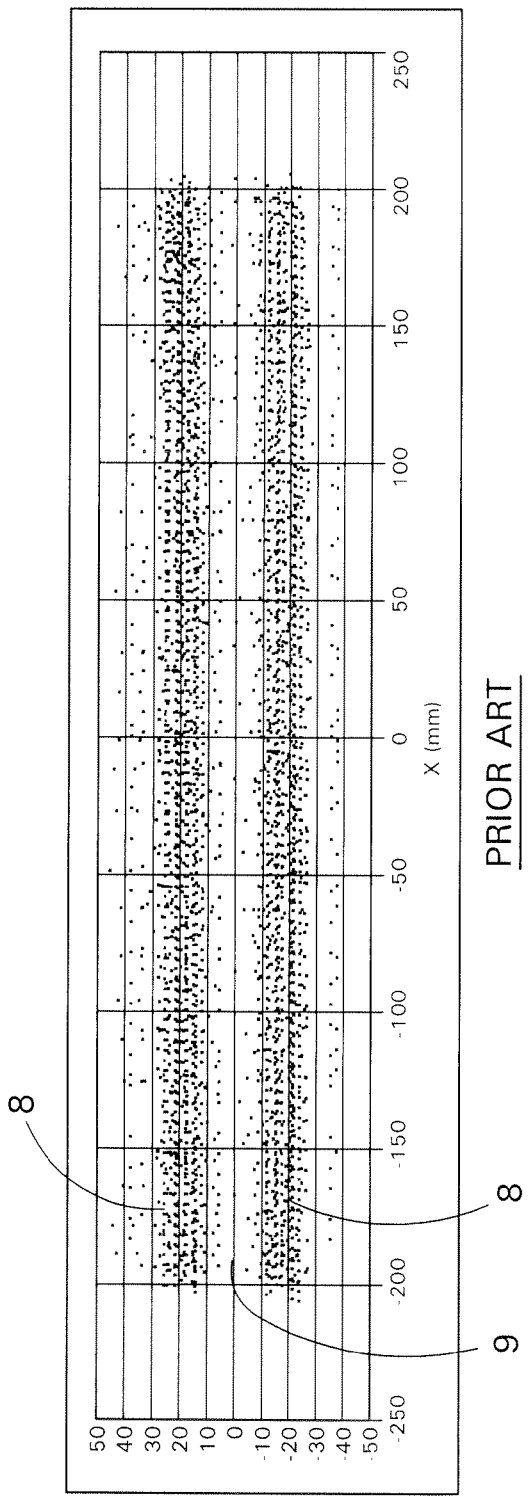
FIG. 1 is a graph depicting uneven electron distribution with respect to length and width for an exit window foil in a prior art electron beam emitter.
Figure 12:
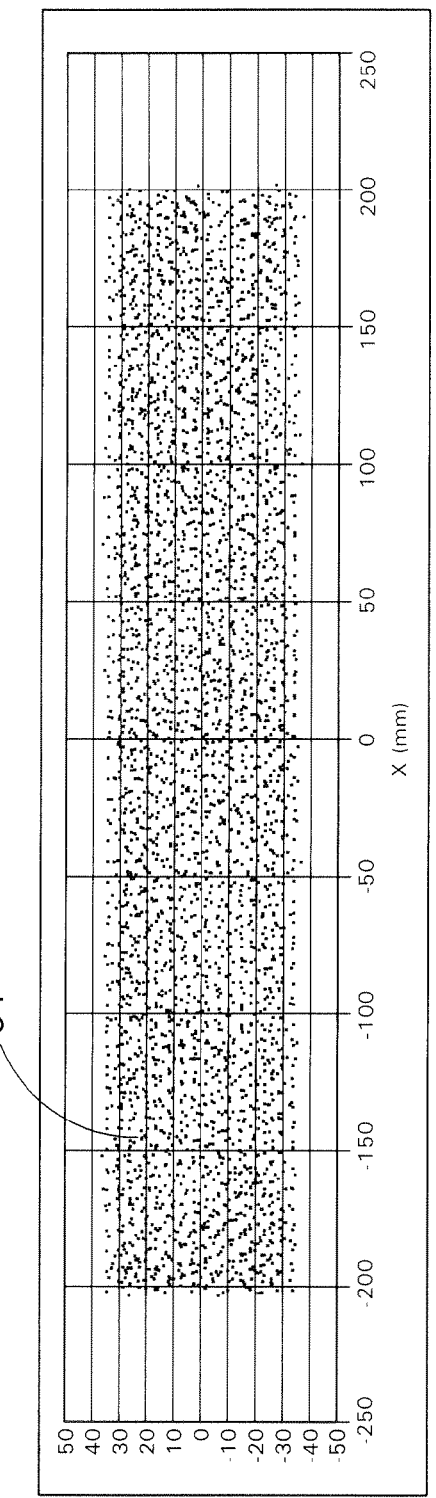
FIG. 12 is a graph depicting an evenly dispersed electron distribution with respect to length and width for an exit window foil in embodiments of the present invention.
Figure 10:
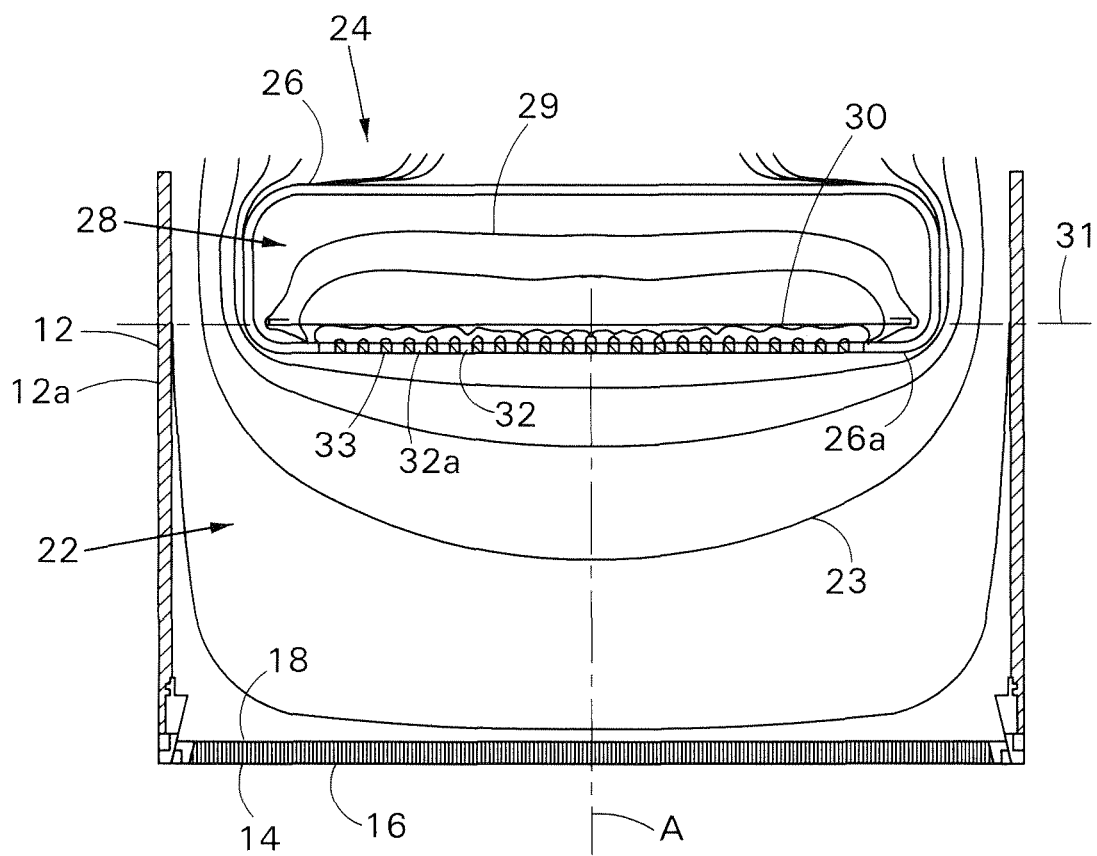
FIG. 10 is a schematic drawing depicting electrical potential contour lines within the electron gun, and between the electron gun and exit window.
Figure 11:
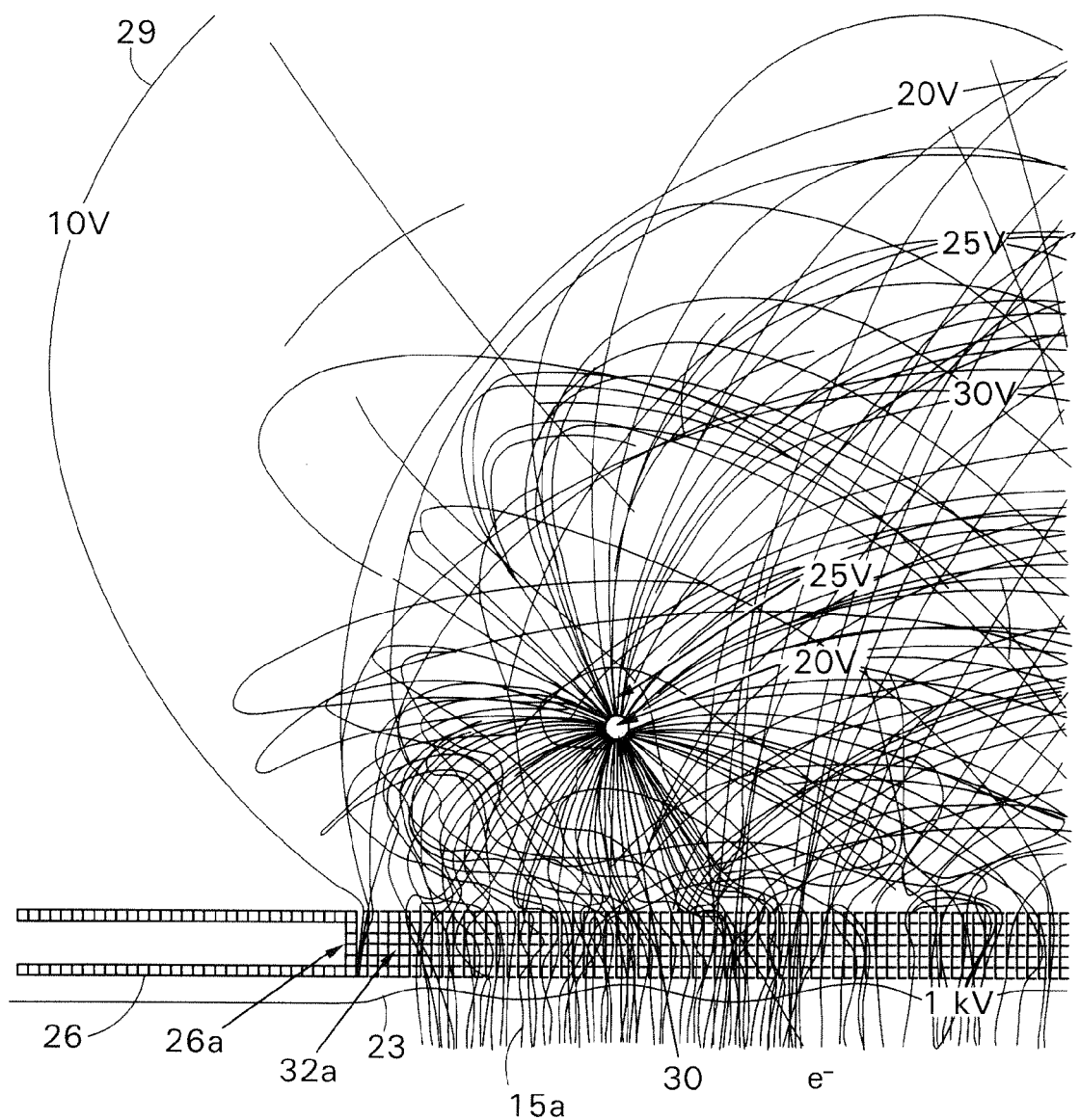
FIG. 11 is an enlarged schematic drawing depicting lateral dispersion of electrons.
Figure 13:
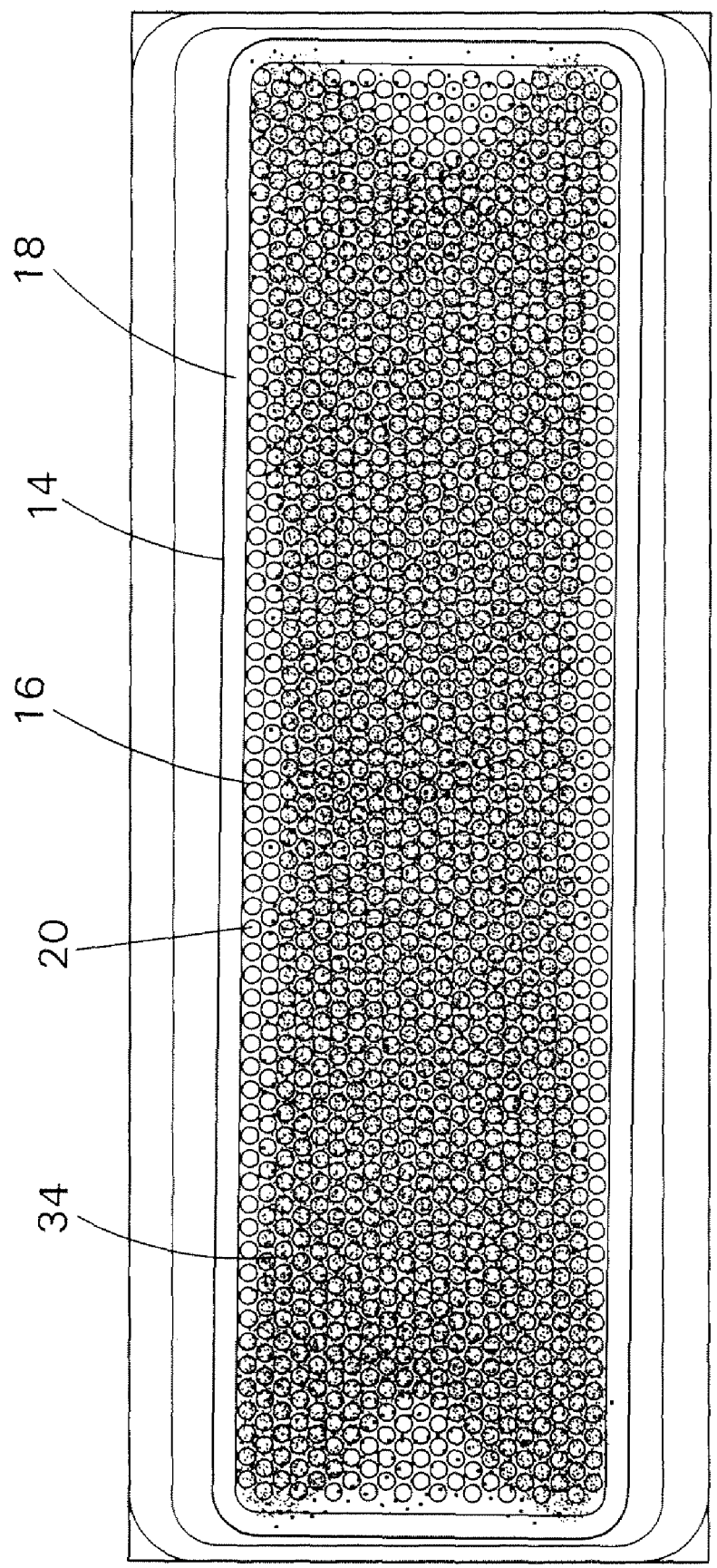
FIG. 13 is a schematic drawing of an exit window depicting a dispersed electron distribution.

In prior art electron guns which have a series of narrow round holes below elongate filaments, the electrons generated by the filaments tend to focus into a narrow beam that mostly pass through the narrow holes that are aligned with the elongate filament, thereby concentrating the electrons into a narrow line, such as seen in FIG. 1. In contrast, the transverse slots 32a can allow the high voltage electrical field 23 that is imposed between the electron gun housing 26 and the exit window 14 to leak or extend into the electron gun housing 26 by penetrating into the electron gun housing 26 at each slot 32a, to form a transverse or lateral electrical field region 29 extending a distance or depth f (FIG. 9) within the electron gun housing 26, which can extend along as well as transverse or lateral to, and surround the electron sources 30 or axes 31. Reference numeral 29 points to an equal potential line of transverse electrical field region 29. As seen in FIGS. 9-11, the depth f of the transverse electrical field region 29 can extend into the electron gun housing 26 beyond the location of the electron sources 30, or past the distance or height h. This can surround, immerse, position or locate the electron sources 30 within the transverse electrical field region 29. The size and strength of the transverse electrical field region 29 can be optimized by the size or length and width of the slots 32a and ribs 33. There are typically no components located between portion 26a of the electron gun 24 and the exit window 14 along axis A to interfere with or disturb the shape of the electrical field 23 imposed between the electron gun housing 26 and the exit window 14. The transverse electrical field region 29 is at a more positive electrical potential than the electron sources 30 to cause or allow elections e⁻ from the electron sources 30 to spread laterally relative to the electron sources 30 and axes 31, to be wider than the width $W_E$ of the electron sources 30, as shown in FIGS. 4, 9 and 11, and disperse in an even distribution instead of focusing into a narrow line when exiting housing 26. Such an even distribution or dispersion can be seen in the graph of FIG. 12 where the pattern of electrons 34 at the exit window foil 16 is evenly distributed both along the length and laterally. FIG. 13 depicts another possible electron distribution and pattern of electrons 34 on an exit window 14. When the electrons extracted from the electron gun housing 26 in an internal electron beam 15a for acceleration out the exit window 14 are in such a laterally dispersed manner, the electron beam 15 exiting the exit window 14 can also be laterally dispersed. The even electron distribution can result in uniform irradiation of substances or products by electron beam emitter 10.

By positioning the electron sources 30 within the transverse electrical field region 29, electrical potential wells 35 (FIG. 9) can form around the electron sources 30. The electrical potential wells 35 are regions that are more electrically positive than the electron sources 30, which initially accelerates and disperses the electrons radially away from each electron source 30 in a circular pattern or in all directions (FIGS. 4 and 11), before being directed to the electron permeable region 32 by the effect of electrical field 23. Such initial acceleration can laterally disperse the electrons relative to electron sources 30 before reaching the electron permeable region 32 for extraction from the electron housing 26. The deeper or larger the potential well 35, the greater distance the electrons can move radially outwardly and then spread or disperse laterally. Electron sources 30 positioned closer to the electron permeable region 32 and electrical field 23, and having a small height h (FIG. 9), can have larger potential wells 35 than if positioned further away (having a larger height h). The strength of the transverse field region 29 closer to the electron permeable region 32 is typically stronger than at locations further away. FIG. 11 depicts one example of electrical field potential levels within and outside an embodiment of the electron gun housing 26 where particular locations in the transverse field region 29 can range from 10V to 30V with respect to the electron gun housing 26, with 10V locations being further away from the electron permeable region 32 and slots 32a, and where the potential of electrical field 23 outside the electron gun housing 26 can be at least 1 KV. The electron sources 30 can be at 0-20 volts with respect to the electron gun housing 26. In other embodiments, referring to FIG. 10, the transverse field region 29 within electron gun housing 26 can have field regions ranging from about 10V to 50V with respect to the electron gun housing 26, and the potential of electrical field 23 outside housing 26 can range from about 5 to 150 KV with respect to the electron gun housing 26. In still other embodiments these can vary.

The slots 32a can have a length and width $W_S$ wide enough to form a transverse field region 29 sufficiently extending to and around or beyond the electron sources 30, as well as to provide sufficient openings for the passage of dispersed electrons from the electron gun housing 26. In addition, the ribs 33 can be made sufficiently thin to minimally impede the path of the electrons extracted from the housing 26 of the electron gun 24, while at the same time, can be sufficiently close enough together to provide uniform voltage regions across the electron permeable region 32 to uniformly accelerate the dispersed electrons in the internal electron beam 15a from the electron gun 24 to the exit window 14. A suitable slot width, rib width, and spacing configuration or ratio can provide an optimum combination of the size and intensity of the transverse electrical field region 29 for the lateral electron dispersion relative to the electron sources 30, passage of the electrons through the electron permeable region 32 for extraction from the electron gun 24, and uniform acceleration from the electron gun 24 to the exit window 14.

The slots 32a can be integrally formed within a planar sheet portion 26a of housing 26 which allows suitable slot width to rib width ratios to be made along axis 25 in a planar fashion integrally within portion 26a. As a result, the electron permeable region 32 can be flush with portion 26a, and not protrude from the interior and exterior surfaces of portion 26a. The slots 32a can be formed on portion 26a, for example, by machining, such as by milling with a CNC machine, by stamping with a die, by EDM, or other suitable methods. The integrally formed electron permeable region 32 also can be laterally surrounded by laterally extending flush planar surfaces of portion 26a. The integral configuration of electron permeable region 32 can provide consistency in the shape of the transverse field regions 29 which are formed within the interior 28 of electron gun housing 26.

The electron gun housing 26 in some embodiments can be formed of two or more pieces that can be assembled together. The portion 26a of the housing 26 in some embodiments can be part of a housing portion 27 (FIGS. 6 and 7) which can be circular or generally cup shaped, and can be made of sheet metal. The housing portion 27 can include a series of holes 38 for assembly with other components of the electron gun 24. The length L and width D of the electron permeable region 32 of housing 26 can vary depending upon the size of emitter 10, exit window 14, and the length, number and spacing of the electron sources 30. For example, the length L of electron permeable region 32 in some embodiments of FIGS. 6 and 7 can commonly range between about 5 and 10 inches long, and in some examples, can be about 6¾ inches, about 7¼ inches and about 7½ inches long. In other embodiments, length L can be less than 5 inches or greater than 10 inches. The width D of the electron permeable region 32 for two electron sources 30 or filaments can commonly be about 1½ to 2½ inches wide, with about 2 inches being common, and in one embodiment is about 1.8 inches. The length and width of the internal beam 15a of electrons passing through the electron permeable region 32 can generally have dimensions corresponding to the length L and width D. In other embodiments, width D can be less than 1½ inches and greater than 2½ inches.

In some embodiments, the slots 32a can have a constant or consistent width $W_s$ which can commonly be about ⅛ to 3/16 inches, for example, 0.156 inches, and can be at an angle of 60° relative to axis 25, with a pitch P of about ¼ inches, for example 0.22 inches. In some embodiments, the width $W_s$ of slots 32a can be less than ⅛ inches or greater than 3/16 inches, and can be at other angles α, and at pitches P more than or less than ¼ inch. The length of the slots 32a can vary depending upon the situation at hand, as well as the angle α, and can often be about 1½ to 2 inches. The ribs 33 can also be at angle α, and separate or space the slots 32a from each other. Ribs 33 can often range between 0.030 inches to 0.040 inches thick, and in some embodiments can be less than 0.030 inches or more than 0.040 inches. The ribs 33 can be about 1/32 of an inch thick, such as 0.034 or 0.035 inches. For ribs 33 that are 0.034 inches thick positioned between slots 32a having a width $W_s$ of 0.156 inches on a longitudinal pitch P of 0.22 inches, the electron permeable region 32 can have a slot width to rib width ratio of about 4.5 to 1. In other embodiments, the slot width to rib width ratio can range from about 3 to 1 to about 6 to 1. Depending upon the length L of electron permeable region 32, there can often be for example, about 30 to 40 slots 32a, for example, 33 or 35 slots 32a. The ends of the slots 32a can be rounded, and some slots 32a near the ends of the electron permeable region 32 can be truncated or shorter to make the electron permeable region 32 generally rectangular in shape.

In some embodiments, the electron permeable region 32 can extend laterally relative to the diameter or width $W_E$ of electron sources 30 and axes 31 by a distance X of about 3/8 to about 1/2 inch, and the electron sources 30 can be spaced apart from each other by about 5/8 to about 1 inch (about 17-24 mm). With the slots 32a extending such a distance X, the electrons can be spread about 3/8 to about 1/2 inch to either side of an axis 31. In some embodiments, the electron sources 30 can be narrow filaments, for example, 0.009 inches thick, such that the electrons are spread laterally relative to the width $W_E$ by approximately the distance X. The distance X can vary depending upon the width D of the electron permeable region 32, and the number of electron sources 30 and height h. The electron sources 30 in some embodiments can be spaced from the electron permeable region 32 by a distance or height h of about 2 to 12 mm (about 0.08-0.5 inches), such as 2, 3, 4, 7, 10, and 12 mm (0.08, 0.12, 0.16, 0.28, 0.4 and 0.47 inches), to be within the desired location of the transverse field region 29 for desired field strength or desired lateral electron spreading. Heights h of 2-6 mm are common, for example 4 mm.

Referring to FIGS. 14 and 15, the support plate 18 of exit window 14 can be formed of copper or a copper alloy, and can have a rectangular grid of round holes 20 for allowing electrons extracted from the electron gun 24 to pass therethrough for reaching and passing through exit window foil 16. Both the support plate 18 and the exit window foil 16 can be rectangular in shape. The holes 20 can be gradually or progressively continuously angled outwardly moving toward the opposite ends, as seen in FIG. 15, to match electron beam trajectory and achieve efficient or best transmission. In other embodiments, the support plate 18 for emitter 10 can include only holes 20 that are straight. In still other embodiments, the support plate 18 can have slotted holes which are sized, shaped, positioned and oriented to correspond or match the slots 32a in the electron gun 24. For example, the holes 20 in support plate 18 can be shaped and oriented, with a pattern such as the slots 32a in FIG. 7.

Figure 16:
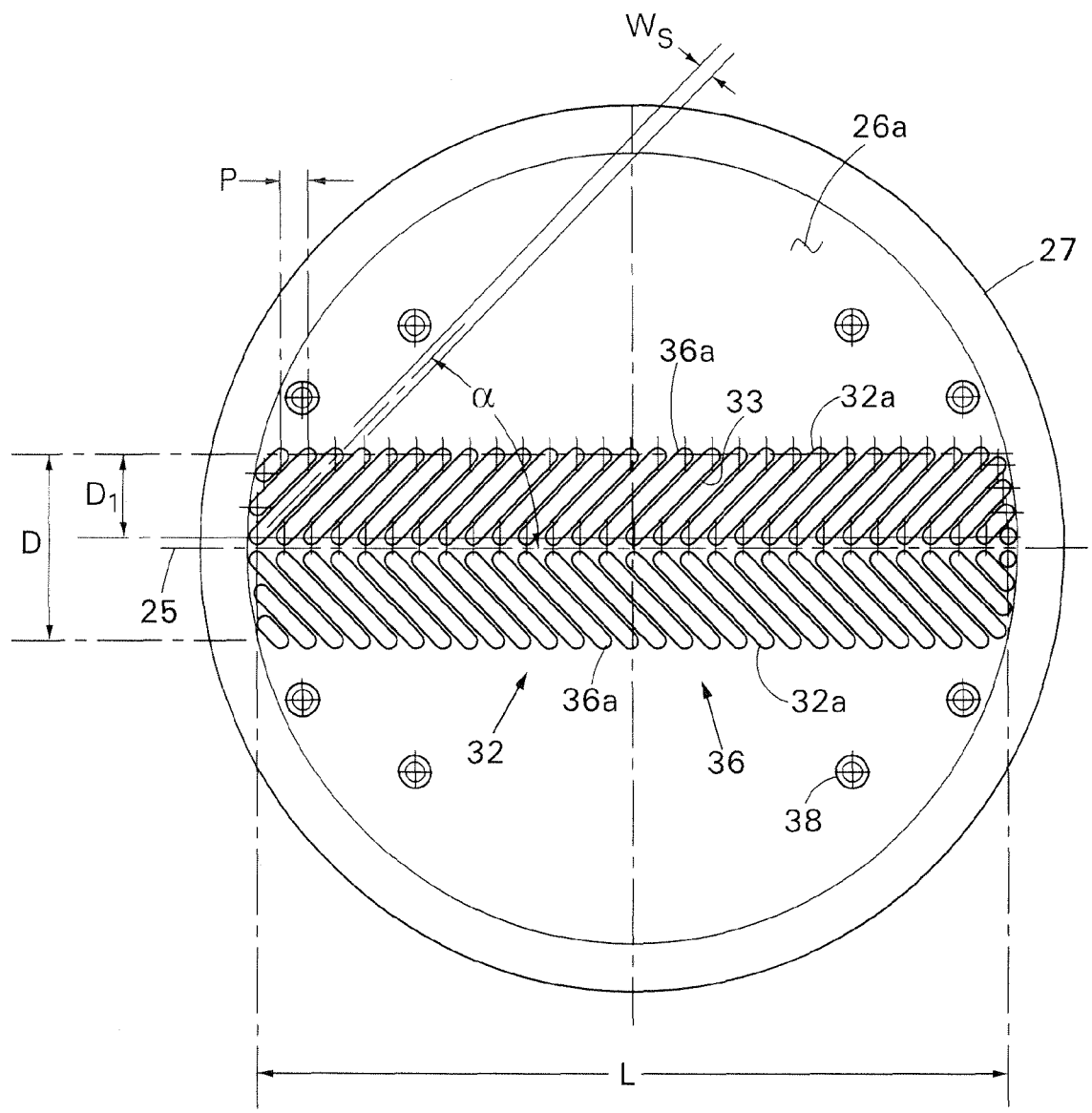
FIG. 16 is a front view of another embodiment of a housing portion for an electron gun.
Figure 17:
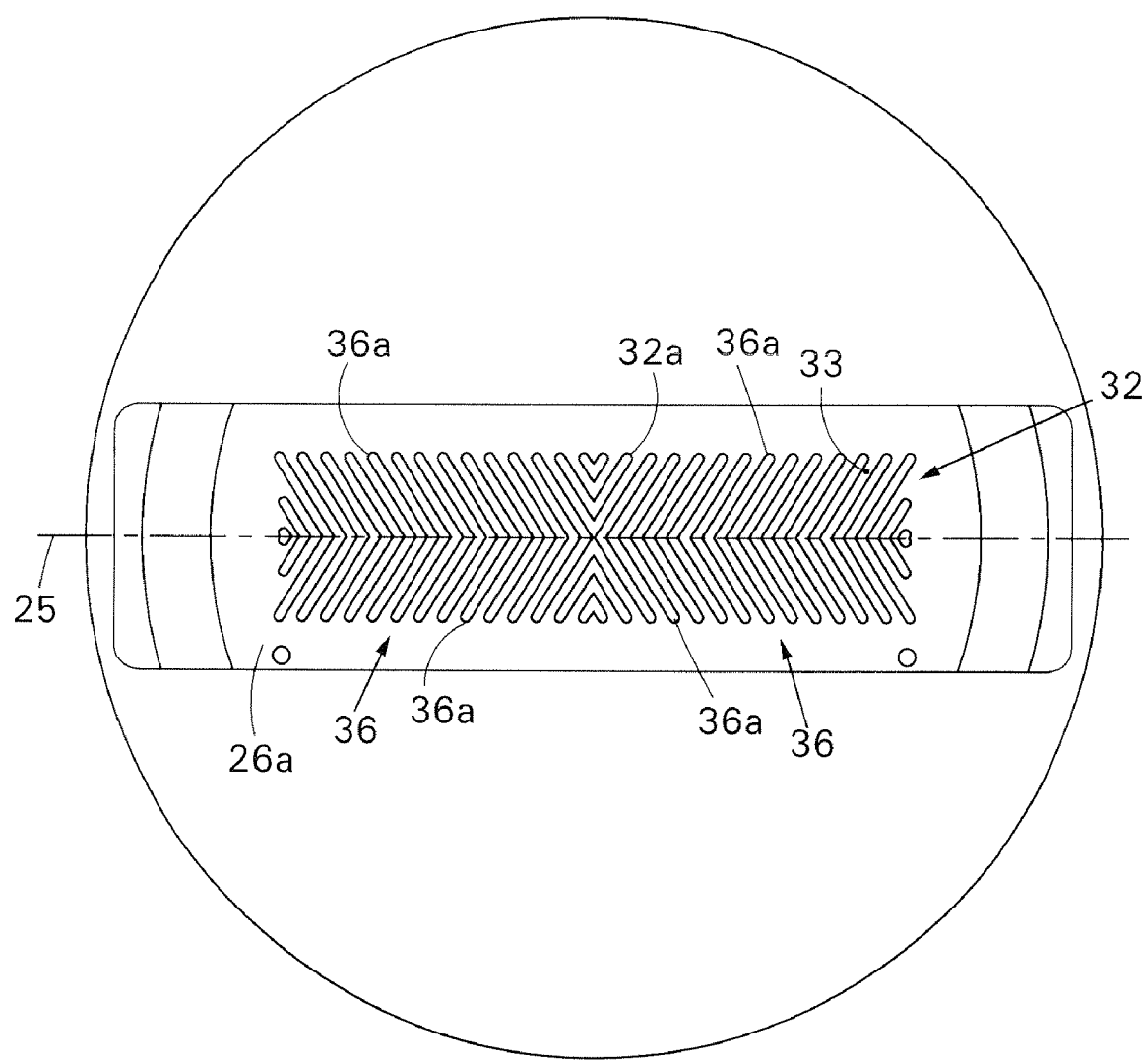
FIG. 17 depicts still another slot configuration for an electron gun.

FIG. 16 depicts another embodiment of a housing portion 27. The electron permeable region 32 can include slots 32a that are arranged or positioned in two rows 36a extending on opposite sides of axis 25 parallel or side by side to form a double chevron or angled slot pattern 36. The slots 32a in the two rows 36a can be angled relative to each other to form a vee shaped chevron pattern. The slots 32a in each row 36a can be angled at an acute angle α relative to axis 25, which can in some embodiments be at the same angle and can be about 45°. The slots 32a can be spaced apart by a longitudinal pitch P relative to axis 25 of about 1/4 inch (such as 0.27 inches). The slots 32a can have a width $W_s$ of about 1/8 to 3/16 inches (for example, 0.156 inches) and the ribs 33 can be about 0.030 to 0.040 inches, or 1/32 inches wide (for example 0.034 inches). The length L of electron permeable region 32 can be about 7½ inches and the width D can be about 2 inches, for example 1.8 inches. The width $D_1$ of each row 36a can be about 3/4 to 1 inches wide, for example 0.9 inches. In other embodiments the dimensions of slots 32a, ribs 33, angle α and electron permeable region 32 can vary, for example, as previously mentioned. It is understood that the configuration, dimensions and angles of the various electron permeable regions 32 shown and described, can vary depending upon the size of the emitter 10, as well as the number and length or size of electron sources 30. Referring to FIG. 17, in another embodiment, the electron permeable region 32 can include two chevron or angled slot patterns 36 joined together at the center, and the slots 32a in each row 36a can also be connected or joined together. The slots 32a can angle outwardly toward the ends. The electron permeable region 32 can be integrally formed within a rectangular piece of sheet metal which is assembled to a corresponding opening in the electron gun housing 26. This design can be employed with the other patterns of slots 32a disclosed.

Figure 18:
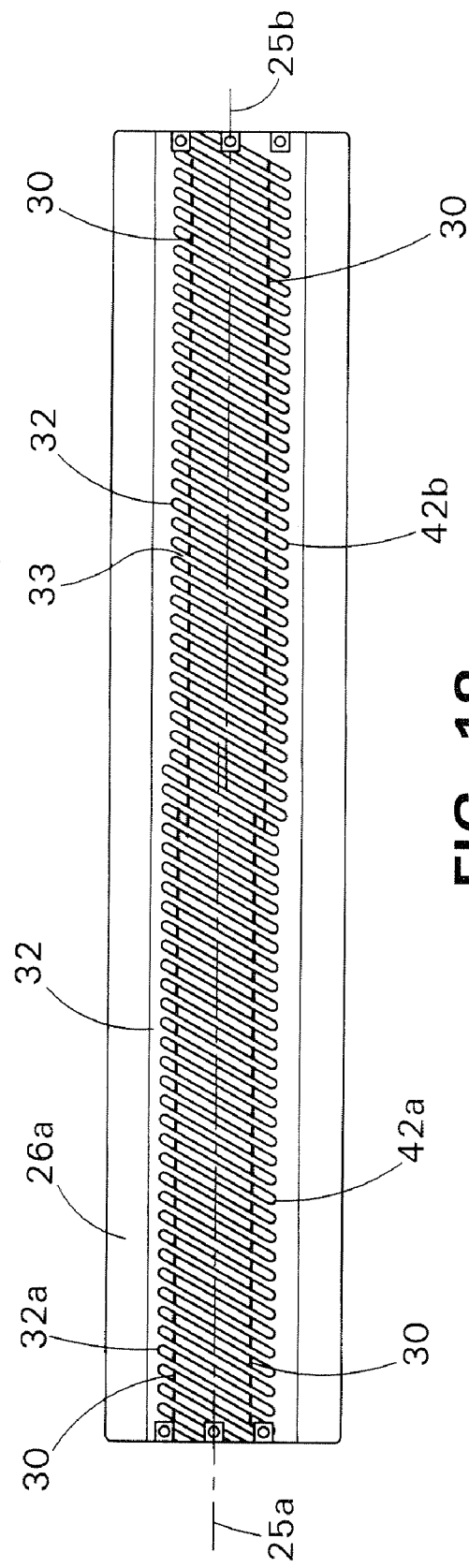
FIG. 18 depicts yet another slot configuration.
Figure 19:
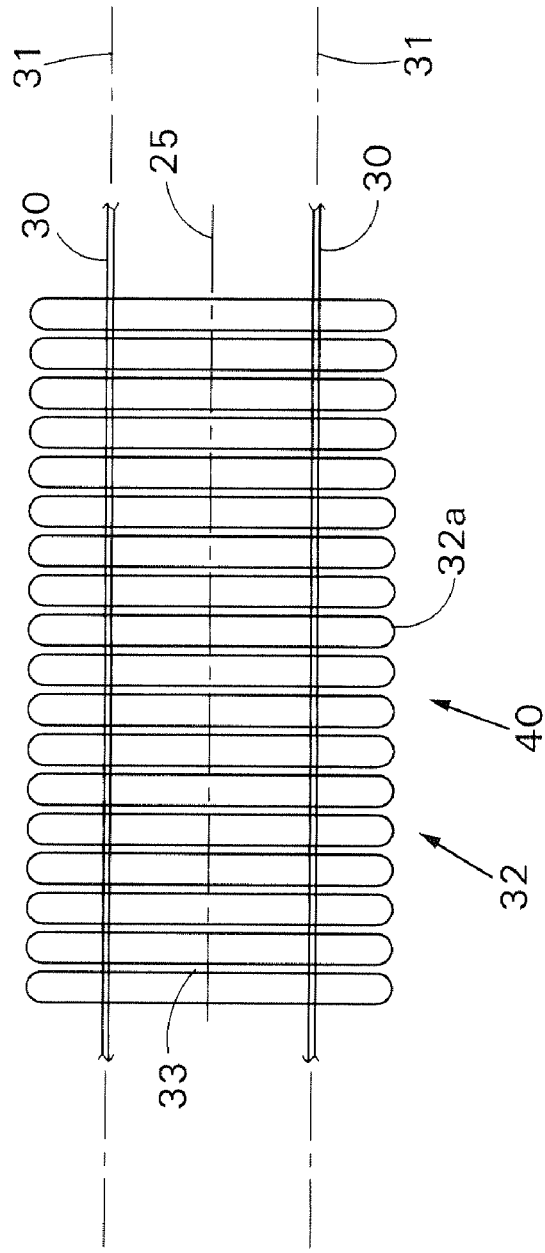
FIG. 19 is a schematic drawing depicting another embodiment of slot orientation relative to two elongate electron generating sources.

Referring to FIG. 18 in yet another embodiment, the electron permeable region 32 can have two rows of slots 32a, 42a and 42b, longitudinally joined together and positioned along respective longitudinal axes 25a and 25b. The axes 25a and 25b can be offset from each other, and the electron sources 30 for each row 42a and 42b can also be offset from each other. The slots 32a can in some embodiments have a length of about 1½ inches. Referring to FIG. 19, in another embodiment, the electron permeable region 32 can have a pattern 40 with slots 32a which are at a right angle or 90° to axis 25.

Figure 20:
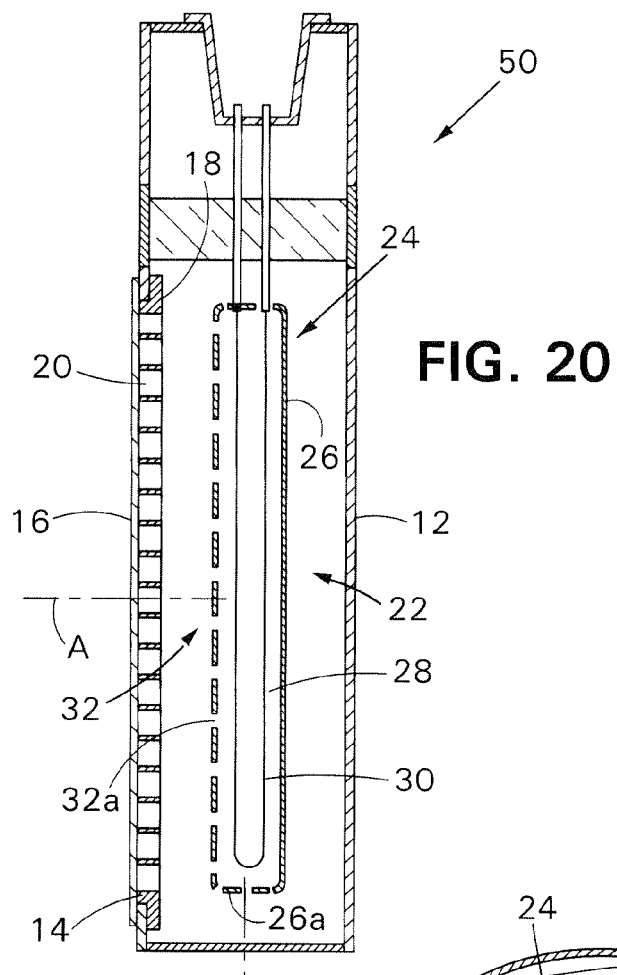
FIG. 20 is a sectional drawing of another embodiment of an electron beam emitter in the present invention.
Figure 21:
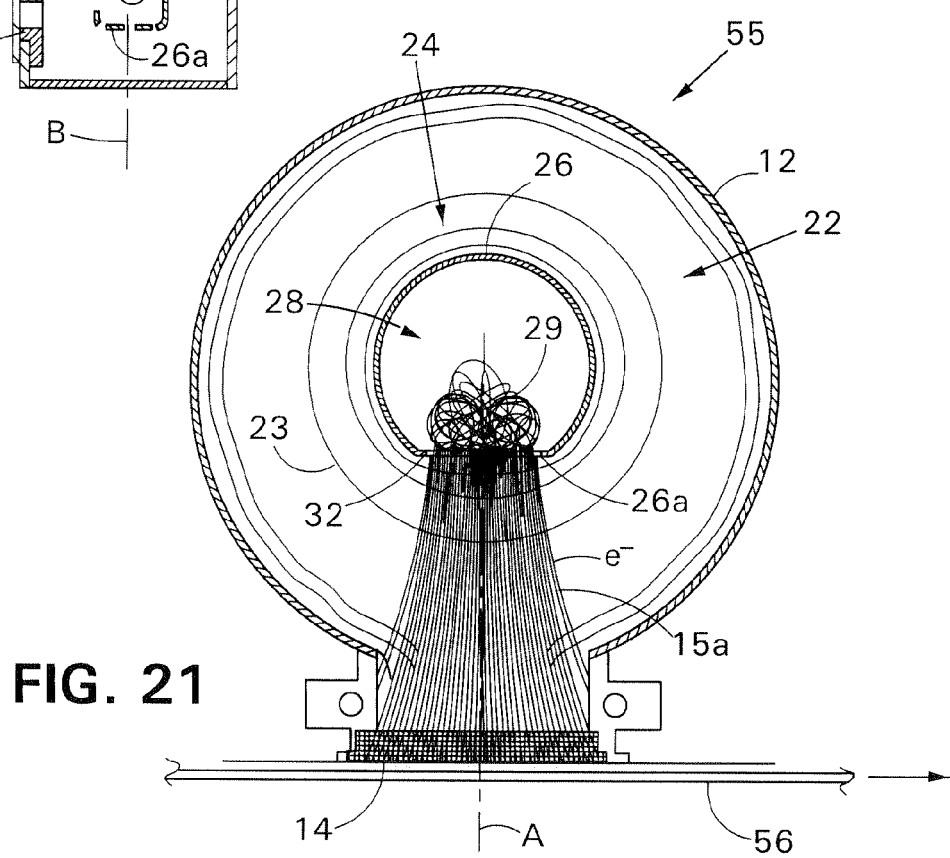
FIG. 21 is a schematic drawing of yet another embodiment of an electron emitter in the present invention.

Referring to FIG. 20, electron beam emitters of other various configurations can include the electron permeable regions 32 of the present invention. For example electron beam emitter 50 can have an electron gun 24 and exit window 14 aligned along axis A which is lateral or normal to the longitudinal axis B of the emitter 50. FIG. 21 depicts another embodiment of an electron beam emitter 55, and is shown irradiating a moving product or web 56.

Although in some embodiments, the ribs 33 between the slots 32a can form slight intermittent interruptions in the electrons exiting the electron gun housing 26 along axis 25, under most circumstances, sufficient electron scattering or dispersion usually occurs, resulting in generally even electron distribution by the time the electrons reach the product to be irradiated. However, in cases where the electron beam emitter is used in a low pressure or vacuum environment and/or close to a moving product or web 56, by having slots 32a in the electron gun housing 26 that are angled at angle α, if there is any chance of electron masking by ribs 33, or in embodiments where the support plate 18 of the exit window 14 has slots 20 that are oriented to match the orientation of slots 32a, a moving product or web 56 can be irradiated with the electron beam emitter 55 oriented such that the product 56 moves relative to overlapping angled slots 32a of the electron gun housing 26, instead of parallel to slots 32a, as a measure to ensure uniform irradiation. Such irradiation can also be conducted with other electron beam emitters in the present invention.

While this invention has been particularly shown and described with references to example embodiments thereof, it will be understood by those skilled in the art that various changes in form and details may be made therein without departing from the scope of the invention encompassed by the appended claims.

For example, although the electron sources 30 and the electron permeable region 32 are shown to extend along straight axes 31 and 25, in other embodiments, the electron sources 30 can have configurations that are nonlinear, such as curved, angled, are not elongate, or are wide. In such situations, electron permeable region 32 can be correspondingly shaped to disperse the generated electrons, and the exit window 14 can be also correspondingly shaped. In addition, although the electron permeable region 32 has been shown to have a length L and width D that generally matches the electron sources 30, the length L and D can be varied to form a shaped dispersion pattern, or can be nonlinear. Although embodiments of the electron permeable region 32 have been shown to be integrally formed in sheet metal, in other embodiments, the electron permeable region can be formed by fabricating or assembling components together.

What is claimed is:

1. An electron beam emitter comprising:
an electron generator for generating electrons, the electron generator having a housing containing at least one elongate electron source for generating the electrons, the at least one elongate electron source having a width, the electron generator housing having an electron permeable region spaced from the at least one elongate electron source for allowing extraction of the electrons from the electron generator housing, the electron permeable region including a series of narrow elongate slots and ribs formed in the electron generator housing at an acute angle relative to the elongate electron source, the electron permeable region configured and positioned relative to the at least one elongate electron source for laterally spreading the electrons that are generated by the at least one elongate electron source such that the spread of the electrons exiting the electron permeable region is wider than the at least one elongate electron source.

2. The emitter of claim 1 in which the slots are at an angle ranging from about 30° to 90° relative to the elongate electron source.

3. The emitter of claim 1 in which the slots are about ⅛ to 3/16 inches wide and the ribs are about 0.030 to 0.040 inches wide.

4. The emitter of claim 3 in which the electron permeable region has an elongate length and a width, the length of the electron permeable region having a longitudinal axis, the slots being positioned on a pitch of about ¼ inches relative to the longitudinal axis.

5. The emitter of claim 1 in which the electron permeable region includes first and second rows of slots, the slots of the first row being angled relative to the slots of the second row.

6. The emitter of claim 1 in which the electron generator housing is made of sheet metal and has a planar portion, the electron permeable region being integrally formed within the planar portion.

7. The emitter of claim 1 in which the electron permeable region has a slot width to rib width ratio of about 3 to 1 to about 6 to 1.

8. The emitter of claim 1 further comprising a vacuum chamber having an electron beam exit window, the electron generator being positioned within the vacuum chamber and spaced from the exit window for accelerating the electrons out the exit window.

9. The emitter of claim 8 in which the slots and ribs of the electron permeable region are configured to allow an electrical field extending between the electron generator housing and the exit window to penetrate into the electron generator housing through each slot and laterally relative to the at least one elongate electron source to form a transverse electrical field region surrounding the at least one elongate electron source for laterally spreading the electrons relative to the at least one elongate electron source.

10. The emitter of claim 8 in which the exit window includes a support plate supporting an exit window foil, the support plate having a series of holes angled outwardly moving towards two opposite ends.

11. An electron beam emitter comprising:
a vacuum chamber having an electron beam exit window; and
an electron generator for generating electrons for acceleration out the exit window, the electron generator being positioned within the vacuum chamber and spaced from the exit window, the electron generator having a housing containing at least one elongate electron source for generating the electrons, the at least one elongate electron source having a width, the electron generator housing having an electron permeable region spaced from the at least one elongate electron source for allowing extraction of the electrons from the electron generator housing, the electron permeable region including a series of narrow elongate slots and ribs integrally formed in a planar sheet metal portion of the electron generator housing at an acute angle relative to the elongate electron source, the slots and ribs of the electron permeable region being configured to allow an electrical field extending between the electron generator housing and the exit window to penetrate into the electron generator housing through each slot and laterally relative to the at least one elongate electron source to form a transverse electrical field region surrounding the at least one elongate electron source for laterally spreading the electrons relative to the at least one elongate electron source before extraction from the electron generator housing such that the spread of the electrons exiting the electron permeable region is wider than the at least one elongate electron source.

12. The emitter of claim 11 in which the slots are at an angle ranging from about 30° to 90° relative to the elongate electron source.

13. The emitter of claim 11 in which the slots are about ⅛ to 3/16 inches wide and the ribs are about 0.030 to 0.040 inches wide.

14. The emitter of claim 13 in which the electron permeable region has an elongate length and a width, the length of the electron permeable region having a longitudinal axis, the slots being positioned on a pitch of about ¼ inches relative to the longitudinal axis.

15. The emitter of claim 11 in which the electron permeable region includes first and second rows of slots, the slots of the first row being angled relative to the slots of the second row.

16. The emitter of claim 11 in which the electron permeable region has a slot width to rib width ratio of about 3 to 1 to about 6 to 1.

17. The emitter of claim 11 in which the exit window includes a support plate supporting an exit window foil, the support plate having a series of holes therethrough for allowing passage of the electrons, the holes being continuously angled outwardly moving towards two opposite ends.

18. A method of dispersing electrons in an electron beam emitter comprising:
generating the electrons with an electron generator, the electron generator having a housing containing at least one elongate electron source for generating the electrons, the at least one elongate electron source having a width, the electron generator housing having an electron permeable region spaced from the at least one elongate electron source for allowing extraction of the electrons from the electron generator housing; and
configuring and positioning the electron permeable region relative to the at least one elongate electron source for laterally spreading the electrons that are generated by the at least one elongate electron source, the electron permeable region including a series of narrow elongate slots and ribs formed in the electron generator housing at an acute angle relative to the elongate electron source, wherein the spread of the electrons exiting the electron permeable region is wider than the at least one elongate electron source.

19. The method of claim 18 further comprising positioning the slots at an angle ranging from about 30° to 90° relative to the elongate electron source.

20. The method of claim 18 further comprising forming the slots to be about ⅛ to 3/16 inches wide and the ribs to be about 0.030 to 0.040 inches wide.

21. The method of claim 20 further comprising providing the electron permeable region with an elongate length and a width, the length of the electron permeable region having a longitudinal axis, the slots being positioned on a pitch of about ¼ inches relative to the longitudinal axis.

22. The method of claim 18 further comprising providing the electron permeable region with first and second rows of slots, the slots of the first row being angled relative to the slots of the second row.

23. The method of claim 18 further comprising forming the electron generator housing from sheet metal and with a planar portion, the electron permeable region being integrally formed within the planar portion.

24. The method of claim 18 further comprising providing the electron permeable region with a slot width to rib width ratio of about 3 to 1 to about 6 to 1.

25. The method of claim 18 further comprising:
positioning the electron generator within a vacuum chamber having an electron beam exit window, the electron generator being spaced from the exit window; and
extracting the electrons from the electron generator housing and accelerating the electrons out the exit window.

26. The method of claim 25 further comprising configuring the slots and ribs of the electron permeable region to allow an electrical field extending between the electron generator housing and the exit window to penetrate into the electron generator housing through each slot and laterally relative to the at least one elongate electron source to form a transverse electrical field region surrounding the at least one elongate electron source for laterally spreading the electrons relative to the at least one elongate electron source.

27. The method of claim 25 in which the exit window includes a support plate supporting an exit window foil, the method further comprising providing the support plate with a series of holes therethrough for allowing passage of the electrons in which the holes are continuously angled outwardly moving towards two opposite ends for matching trajectories of the electrons.

28. A method of irradiating a product with an electron beam emitter comprising:
generating electrons with an electron generator, the electron generator having a housing containing at least one elongate electron source for generating the electrons, the at least one elongate electron source having a width, the electron generator housing having an electron permeable region spaced from the at least one elongate electron source for allowing extraction of the electrons from the electron generator housing, the electron permeable region including a series of narrow elongate slots and ribs formed in the electron generator housing at an acute angle relative to the elongate electron source, the electron permeable region configured and positioned relative to the at least one elongate electron source for laterally spreading the electrons that are generated by the at least one elongate electron source; and
moving the product and the electron beam emitter relative to each other at an acute angle relative to the slots and ribs of the electron permeable region for irradiating the product with the electrons.

* * * * *